(12) United States Patent
Eytan et al.

(10) Patent No.: US 10,716,197 B2
(45) Date of Patent: Jul. 14, 2020

(54) SYSTEM, COMPUTER PROGRAM PRODUCT, AND METHOD FOR DISSIPATION OF AN ELECTRICAL CHARGE

(71) Applicant: APPLIED MATERIALS ISRAEL LTD., Rehovot (IL)

(72) Inventors: Guy Eytan, Kidron (IL); Emil Weisz, Modiin (IL); Samuel Ives Nackash, Nes Ziona (IL); Albert Karabekov, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 447 days.

(21) Appl. No.: 15/708,974

(22) Filed: Sep. 19, 2017

(65) Prior Publication Data

US 2019/0090335 A1 Mar. 21, 2019

(51) Int. Cl.
| | |
|---|---|
| *H05F 3/06* | (2006.01) |
| *G01R 29/12* | (2006.01) |
| *G01R 31/305* | (2006.01) |
| *G01R 29/24* | (2006.01) |
| *G01R 31/28* | (2006.01) |
| *H05F 3/04* | (2006.01) |

(52) U.S. Cl.
CPC ............ *H05F 3/06* (2013.01); *G01R 29/12* (2013.01); *G01R 29/24* (2013.01); *G01R 31/2831* (2013.01); *G01R 31/305* (2013.01); *H05F 3/04* (2013.01)

(58) Field of Classification Search
CPC . H01J 37/20; H01J 49/00; H01J 49/04; H02S 40/32; G01R 29/12; H05F 3/06
USPC ........ 361/213, 229, 231, 233; 324/550–590; 320/116–149
See application file for complete search history.

(56) References Cited

U.S. PATENT DOCUMENTS

| | | | | |
|---|---|---|---|---|
| 4,908,226 A | * | 3/1990 | Kubena | C23C 16/047 427/526 |
| 7,171,918 B2 | * | 2/2007 | Gavish | C23C 16/047 118/723 FI |
| 2008/0142733 A1 | * | 6/2008 | Zywno | H01J 37/20 250/491.1 |
| 2009/0028683 A1 | * | 1/2009 | Zywno | B82Y 10/00 414/754 |
| 2009/0308734 A1 | * | 12/2009 | Krauss | H01J 37/32935 204/192.13 |
| 2016/0290223 A1 | * | 10/2016 | Mills | F02B 51/02 |

(Continued)

*Primary Examiner* — Tuan T Dinh
(74) *Attorney, Agent, or Firm* — Kilpatrick Townsend & Stockton LLP

(57) ABSTRACT

A computer program product and a method for dissipation of an electrical charge stored in a region of an object. The method may include (a) sensing, by at least one sensor, an electrical charging status of the region of the object, while the object is located within a vacuum chamber and while a gaseous pressure within the vacuum chamber is below a certain vacuum pressure threshold; and (b) performing, based on the charging status of the given region, an electrical charge dissipation process that comprises increasing the gaseous pressure within the vacuum chamber to be within a given gaseous pressure range that facilitates a dissipation, by breakdown, of the electrical charge stored in the region of the object to the vacuum chamber.

20 Claims, 8 Drawing Sheets

(56) References Cited

U.S. PATENT DOCUMENTS

2017/0070180 A1\* 3/2017 Mills .................. H02S 40/32
2017/0104426 A1\* 4/2017 Mills .................. H02S 40/32

\* cited by examiner

SYSTEM, COMPUTER PROGRAM PRODUCT, AND METHOD FOR DISSIPATION OF AN ELECTRICAL CHARGE

BACKGROUND OF THE INVENTION

Electrically insulating surfaces can accumulate large amounts of electrical charge from the environment, colloquially known as "static electricity". The electrical charging, if present in a system, can affect a functionality of the system and may even form a safety hazard.

Electrical charging problems are especially acute in vacuumed environments that lack a gaseous medium that may dissipate the electrical charge.

SUMMARY

According to an embodiment of the invention there may be provided a computer program product, a method, and a system for dissipation of an electrical charge.

BRIEF DESCRIPTION OF THE DRAWINGS

The subject matter regarded as the invention is particularly pointed out and distinctly claimed in the concluding portion of the specification. The invention, however, both as to organization and method of step, together with objects, features, and advantages thereof, may best be understood by reference to the following detailed description when read with the accompanying drawings in which:

Figure 1:
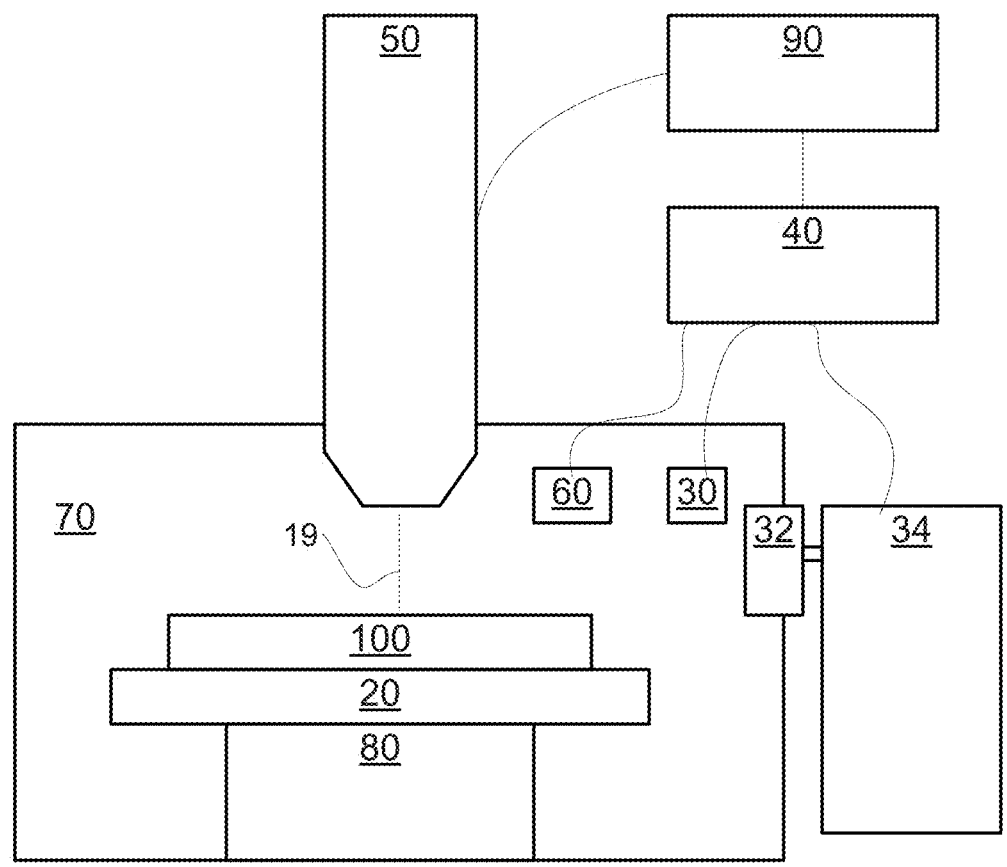
FIG. 1 illustrates an example of a system and a substrate.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a computer program product that stores instructions that once executed by a system result in the execution of the method.

Any reference in the specification to a system should be applied mutatis mutandis to a method that may be executed by the system and should be applied mutatis mutandis to a computer program product that stores instructions that may be executed by the system.

Any reference in the specification to a computer program product should be applied mutatis mutandis to a system capable of executing the instructions stored in the computer program product and should be applied mutatis mutandis to method that may be executed by a system that reads the instructions stored in the non-transitory computer readable medium.

The phrase "and/or" means additionally or alternatively. For example, A and/or B can mean only A, only B, or both A and B.

There may be provided a system, a computer program product and a method for dissipation of an electrical charge stored in a region of an object. The region of the object may be any part of the object. The region may have any shape and/or any size.

The object may be a part of the system. Alternatively, the object may be a substrate or any other item that may be reviewed by the system, inspected by the system and/or measured by the system.

FIG. 1 is an example of a system 10 and substrate 100.

System 10 includes chuck 20, venting inlet 32, pumping system 34, gaseous pressure sensor 30, controller 40, column 50, first electrical charging sensor 60, vacuum chamber 70, a movement mechanism such as mechanical stage 80, and image processor 90.

System 10 may be a metrology system, an inspection system and/or a review system. For example—system 10 may be a scanning electron microscope (SEM) that is arranged to review defects of substrate 100.

The substrate 100 is supported by chuck 20. Chuck 20 may be moved in relation to the vacuum chamber by a mechanical stage 80. Mechanical stage 80 may be a XY mechanical stage, a XYZ mechanical stage, a Rθ mechanical stage, a RθZ mechanical stage, and the like.

The gaseous pressure within vacuum chamber 70 is set by pumping system 34 that is configured to pump the gas out of the vacuum chamber 70 and to inset gas to the vacuum chamber 70 via venting inlet 32. Any other means for controlling the gaseous pressure in the vacuum chamber may be used. The vacuum chamber may include one or more gas inlets and/or outlets. A same opening may be used as an inlet and as an outlet.

During a review process, the column 50 is configured to scan selected areas of the substrate 100 with a primary electron beam.

The review process may be executed while vacuum chamber 70 is vacuumed. Vacuum chamber 70 is vacuumed when the gaseous pressure within the vacuum chamber is below a certain vacuum pressure threshold.

The certain vacuum pressure threshold may or may not exceed 0.001 Torr. The certain vacuum pressure threshold may, for example, range between 0.001 and 0.0000001 Torr—and even below.

Gaseous pressure sensor 30 is configured to measure the gaseous pressure within vacuum chamber 70.

Column 50 irradiates substrate 100 with primary electron beam 19. Primary electron beam 19 is merely an example of a charged particle beam. Column 50 may irradiate substrate 100 with other charged particles such as ions. Column 50 may irradiate substrate 100 with more than a single primary electron beam.

Image processor 90 is configured to receive detection signals from column 50 (for example—from one or more sensors located within column 50). Additionally or alternatively, image processor 90 is configured to receive detection signals from one or more sensors that are located outside column 50.

Image processor 90 is configured to process the detection signals from any of the mentioned above sensors and to generate charge particle images such as SEM images.

Controller 40 may be configured to control the gaseous pressure by controlling pumping system 34.

Controller 40 may control pumping system 34 based on at least one of:
 a. Information, received from first electrical charging sensor 60, about the gaseous pressure within vacuum chamber 70.
 b. Information about an electrical charging status of a region of substrate 100. The information about the electrical charging status may be provided by first electrical charging sensor 60.

Controller 40 may control an electrical charge dissipation process that may include increasing the gaseous pressure within the vacuum chamber to be within a given gaseous pressure range that facilitates a dissipation, by breakdown, of the electrical charge stored in the region of the substrate to vacuum chamber 70.

Once the gaseous pressure within the vacuum chamber is within the given gaseous pressure range then the electrical charge stored in the region of substrate 100 and even other electrical charges stored in the object may be dissipated by breakdown to the vacuum chamber.

The relationship between gaseous pressure values and breakdown voltages is illustrated by Pashcen curves.

For two electrodes that are positioned at a given distance, there is a critical voltage, known as the "breakdown voltage", above which electrical charge will discharge across a gap between the two electrodes. The breakdown voltage is a function of the composition of the gas between the electrodes, the gaseous pressure, and the distance between the electrodes.

Substrate 100 may be regarded as a first electrode while the vacuum chamber 70 may be regarded as another electrode.

For example, for electrodes that are spaced apart from each other by few centimeters, and assuming that the gaseous medium is nitrogen—then a minimal breakdown voltage of 300-500 Volts is achieved at a gaseous pressure range of 0.1-20 Torr.

It should be noted that the object may be the chuck 20 and that one or more regions of the chuck 20 may be discharged.

System 10 is a charged particle system. A charged particle system is a system that irradiates a substrate with one or more charged particle beams. A scanning electron microscope is merely a non-limiting example of a charged particle system. For example—system 10 may be an ion microscope, a transmission electron microscope, and the like.

Figure 2:
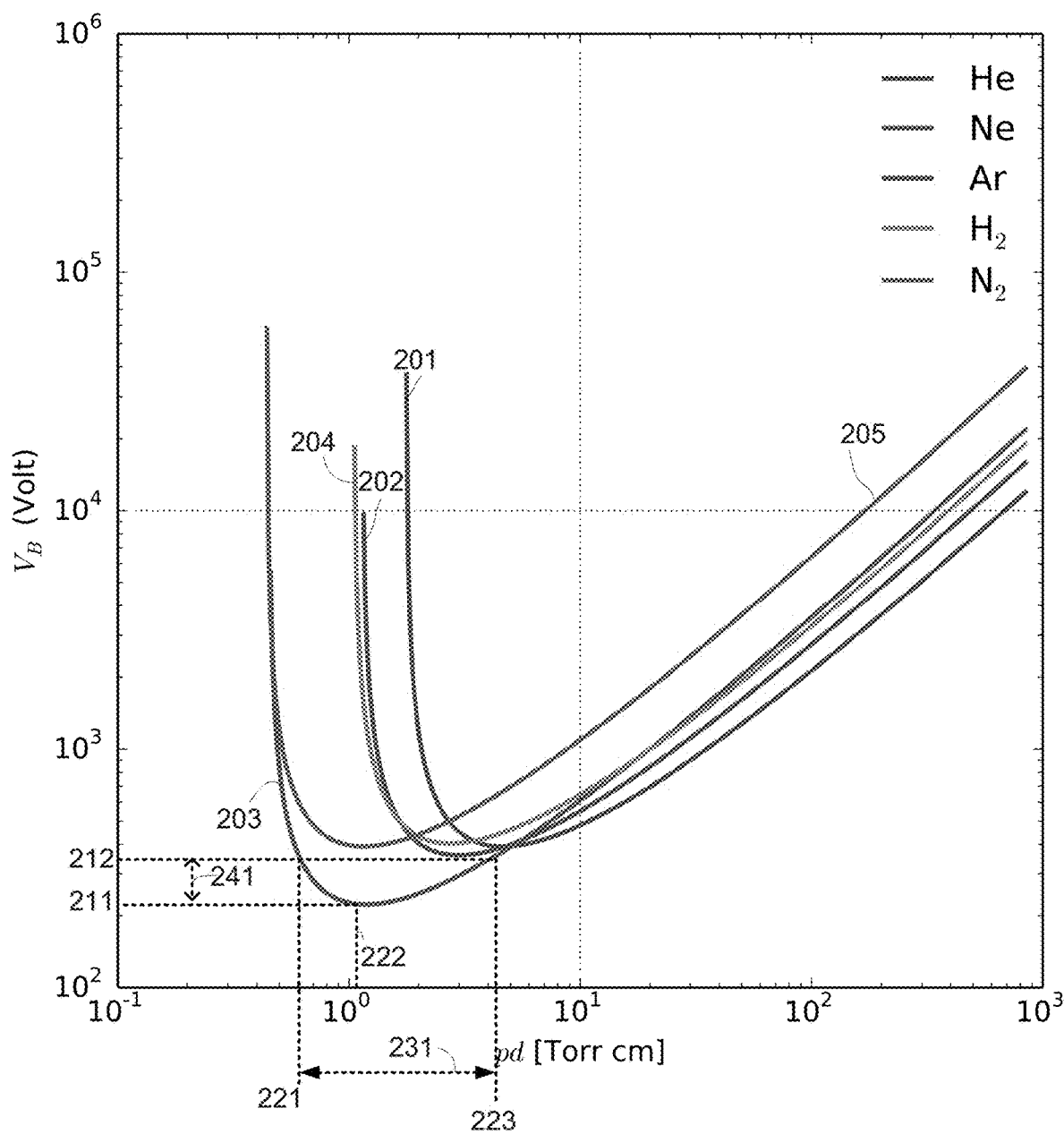
FIG. 2 illustrates examples of Pashcen curves of various gases, an example of a minimal breakdown voltage of Argon, gaseous pressure value that corresponds to the minimal breakdown voltage of Argon, a range of breakdown voltages of Argon and a gaseous pressure range that corresponds to range of breakdown voltages of Argon.

FIG. 2 illustrates examples of Pashcen curves 201, 202, 203, 204 and 205 of various gases, an example of a minimal breakdown voltage 211 of argon, gaseous pressure value 222 that corresponds to the minimal breakdown voltage of argon, range 231 of breakdown voltages of argon and gaseous pressure range 241 that corresponds to range of breakdown voltages of argon.

Pashcen curve 201 was obtained for helium (He).
Pashcen curve 202 was obtained for neon (Ne).
Pashcen curve 203 was obtained for argon (Ar).
Pashcen curve 204 was obtained for hydrogen (H2).
Pashcen curve 205 was obtained for nitrogen (N2).

Range 231 of breakdown voltages of Argon ranges between minimal breakdown voltage 211 of about one hundred and thirty volts and a higher breakdown voltage 212 of about two hundred and fifty volts.

Gaseous pressure range 241 ranges between a first gaseous pressure 221 of about 0.6 Torr and between a second gaseous pressure 223 of about 3.5 Torr.

It may be beneficial to operate at minimal or low breakdown voltages in order to discharge smaller charges.

Defining a range of breakdown voltages may ease the control of the electrical charge dissipation process. The control does not require reaching an exact gaseous pressure level but rather reaching a range of breakdown voltages—which is easier.

The range of breakdown voltages may or may not include the minimal breakdown voltage.

The range of breakdown voltages may include any range of breakdown voltages—and there may be any relationship between the smallest breakdown voltage and the largest breakdown voltage of the range of breakdown voltages.

Figure 3:
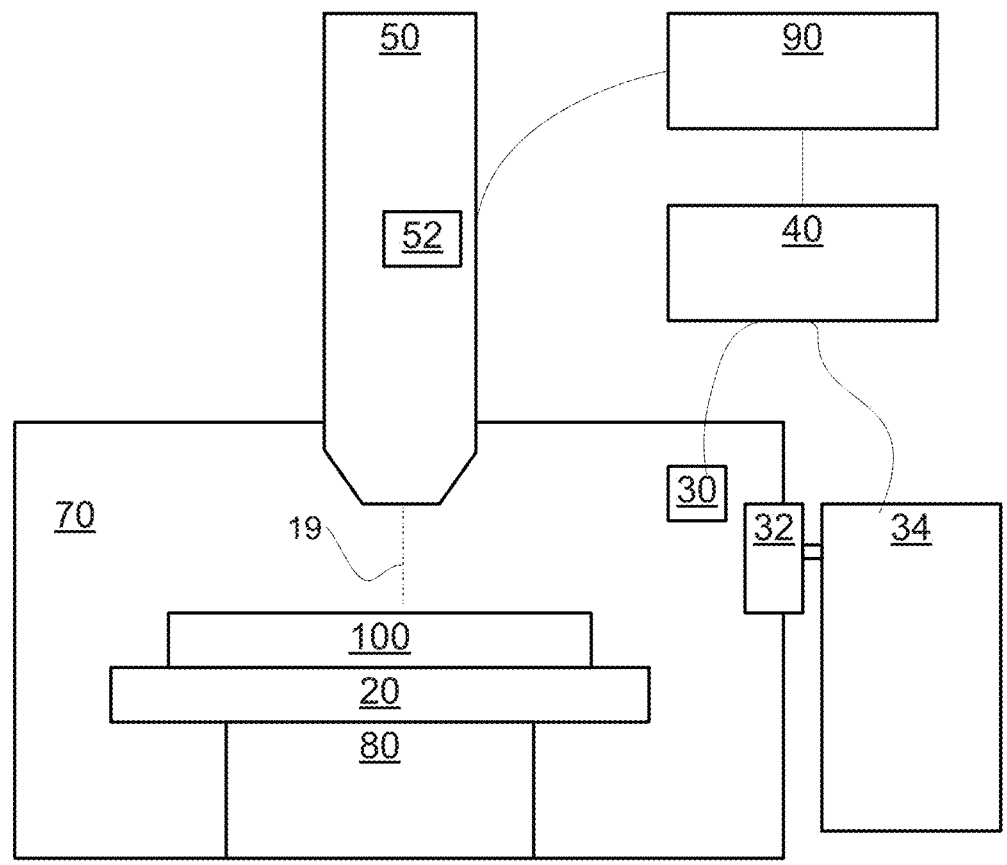
FIG. 3 illustrates an example of a system and a substrate.

FIG. 3 is an example of system 11 and substrate 100.

System 11 includes chuck 20, venting inlet 32, pumping system 34, gaseous pressure sensor 30, controller 40, column 50 that includes an energy spectrum detector 52, vacuum chamber 70, a movement mechanism such as mechanical stage 80 and image processor 90.

The energy spectrum detector 52 belongs to column 50.

The energy spectrum detector 52 may include a charged particle detector that is preceded by an adjustable energy filter. The adjustable energy filter is supplied with a bias voltage. The bias voltage rejects electrons that do not have enough energy to overcome the bias voltage.

The bias voltage may be changed until reaching a cutoff voltage. The cutoff voltage is the lowest bias voltage over which electrons do not reach the charged particle detector.

The cutoff voltage is indicative of the charging status of a region of a substrate that is irradiated by primary electron beam 19.

For example—the cutoff voltage may equal the voltage of the region of the substrate. The voltage of the region of the substrate represents the charge that is stored in the region of the substrate.

Controller 40 may control pumping system 34 based on at least one of:
 a. Information, received from first electrical charging sensor 60, about the gaseous pressure within vacuum chamber 70.

b. Information about an electrical charging status of a region of substrate 100. The information about the electrical charging status may be provided by energy spectrum detector 52.

Figure 4:
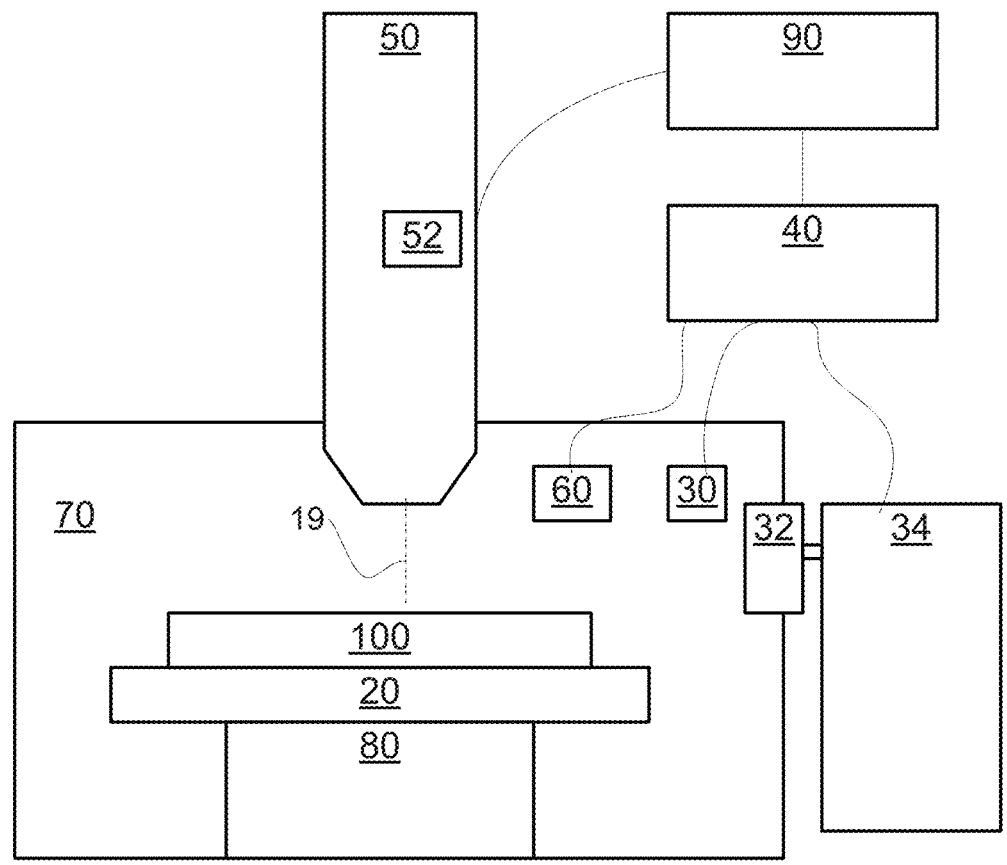
FIG. 4 illustrates an example of a system and a substrate.

FIG. 4 is an example of a system 12 and substrate 100.

System 12 includes chuck 20, venting inlet 32, pumping system 34, gaseous pressure sensor 30, controller 40, column 50 that includes an energy spectrum detector 52, first electrical charging sensor 60, vacuum chamber 70, a movement mechanism such as mechanical stage 80 and image processor 90.

Controller 40 may control pumping system 34 based on at least one of:
  a. Information, received from first electrical charging sensor 60, about the gaseous pressure within vacuum chamber 70.
  b. Information about an electrical charging status of a region of substrate 100. The information about the electrical charging status may be provided by energy spectrum detector 52 and/or by first electrical charging sensor 60.

First electrical charging sensor 60 may or may not belong any electron optics (such as column 50) that is related to the irradiation of substrate 100 by a charged particle beam.

For example—first electrical charging sensor 60 may be a Kelvin probe or any other charging sensor.

First electrical charging sensor 60 may have a relatively large field of view (for example 1 mm by 1 mm). The first electrical charging sensor 60 may sense an average charge within the large field of view—and may be less sensitive to the charging of small isolating elements (having nanometric or micron-scale dimensions) within the large field of view.

Energy spectrum detector 52 detects the electrical charging state of a region of the substrate based on a scanning of the region by primary electron beam 19 that may have a nanometric or micron scale cross section. Accordingly—the energy spectrum detector 52 is much more sensitive to the charging of small regions of the substrate.

Figure 5:
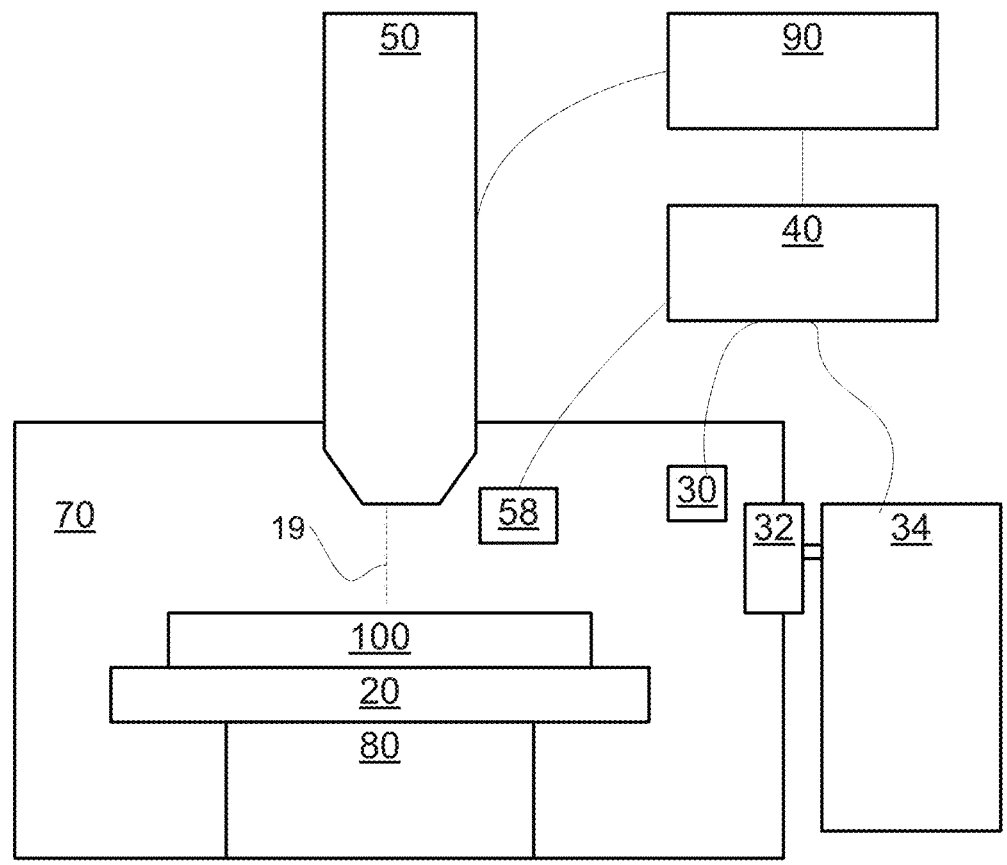
FIG. 5 illustrates an example of a system and a substrate.

FIG. 5 is an example of a system 13 and substrate 100.

System 13 includes chuck 20, venting inlet 32, pumping system 34, gaseous pressure sensor 30, controller 40, column 50, an energy spectrum detector 58 that is located outside column 50, first electrical charging sensor 60, vacuum chamber 70, a movement mechanism such as mechanical stage 80 and image processor 90.

Controller 40 may control pumping system 34 based on at least one of:
  a. Information, received from first electrical charging sensor 60, about the gaseous pressure within vacuum chamber 70.
  b. Information about an electrical charging status of a region of substrate 100. The information about the electrical charging status may be provided by energy spectrum detector 58.

It should be noted that a system may include any combination of energy spectrum detectors and/or other types of sensors for electrical charging detection.

Figure 6:
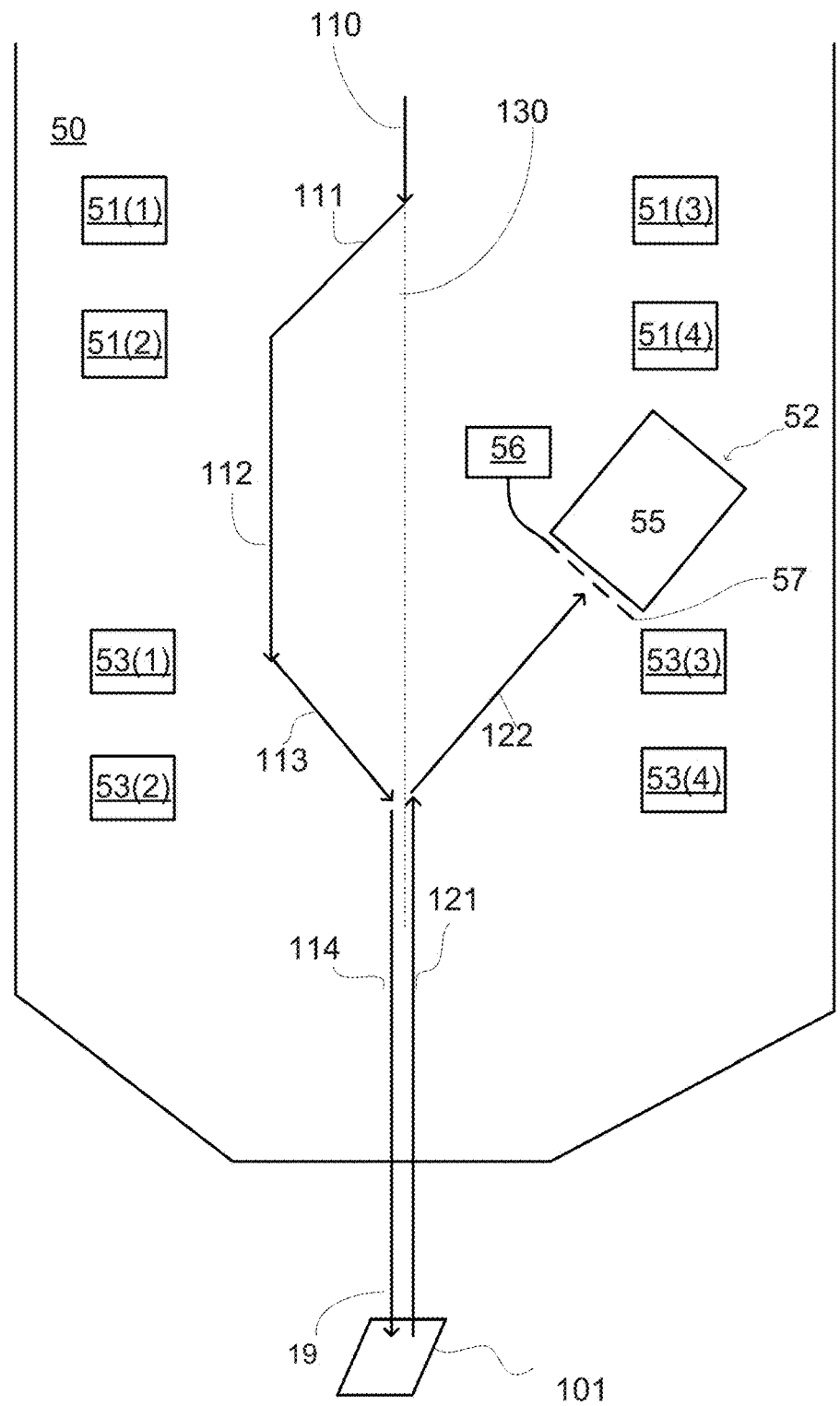
FIG. 6 illustrates an example of a column and a region of a substrate.

FIG. 6 illustrates an example of column 50.

Column 50 include an electron gun (not shown) for generating a primary electron beam 19, as well as multiple control and voltage supply units (not shown), and multiple electron optic elements.

Primary electron beam 19 propagates 110 along an optical axis 130 until it is first deflected 111—away from optical axis 130—and then is second deflected along an axis 112 that is parallel to optical axis 130 and is spaced away from optical axis 130.

The first and second deflections are performed by a first set of deflectors that includes deflectors 51(1), 51(2), 51(3) and 51(4).

The primary electron beam 19 is then third deflected 113—towards optical axis 130 and then is fourth deflected to propagate along another optical axis 114 until impinging on region 101 of substrate 100. The other optical axis 114 may overlap optical axis 130, or may be proximate to optical axis 130 and parallel to optical axis 130.

The third and fourth deflections are performed by a second set of deflectors that includes deflectors 53(1), 53(2), 53(3) and 53(4).

Region 101 may be of any shape and/or size.

Electrons reflected from region 101 of substrate 100 propagate along axis 121 and then are deflected 122 towards energy spectrum detector 52.

Energy spectrum detector 52 includes charged particle detector 55 that is preceded by an adjustable energy filter such as grid 57. The adjustable energy filter is supplied with a bias voltage from bias voltage supply unit 56.

Controller 40 may control bias voltage supply unit 56. Bias voltage supply unit 56 may generate a bias voltage of different values in order to find the cutoff voltage.

Figure 7:
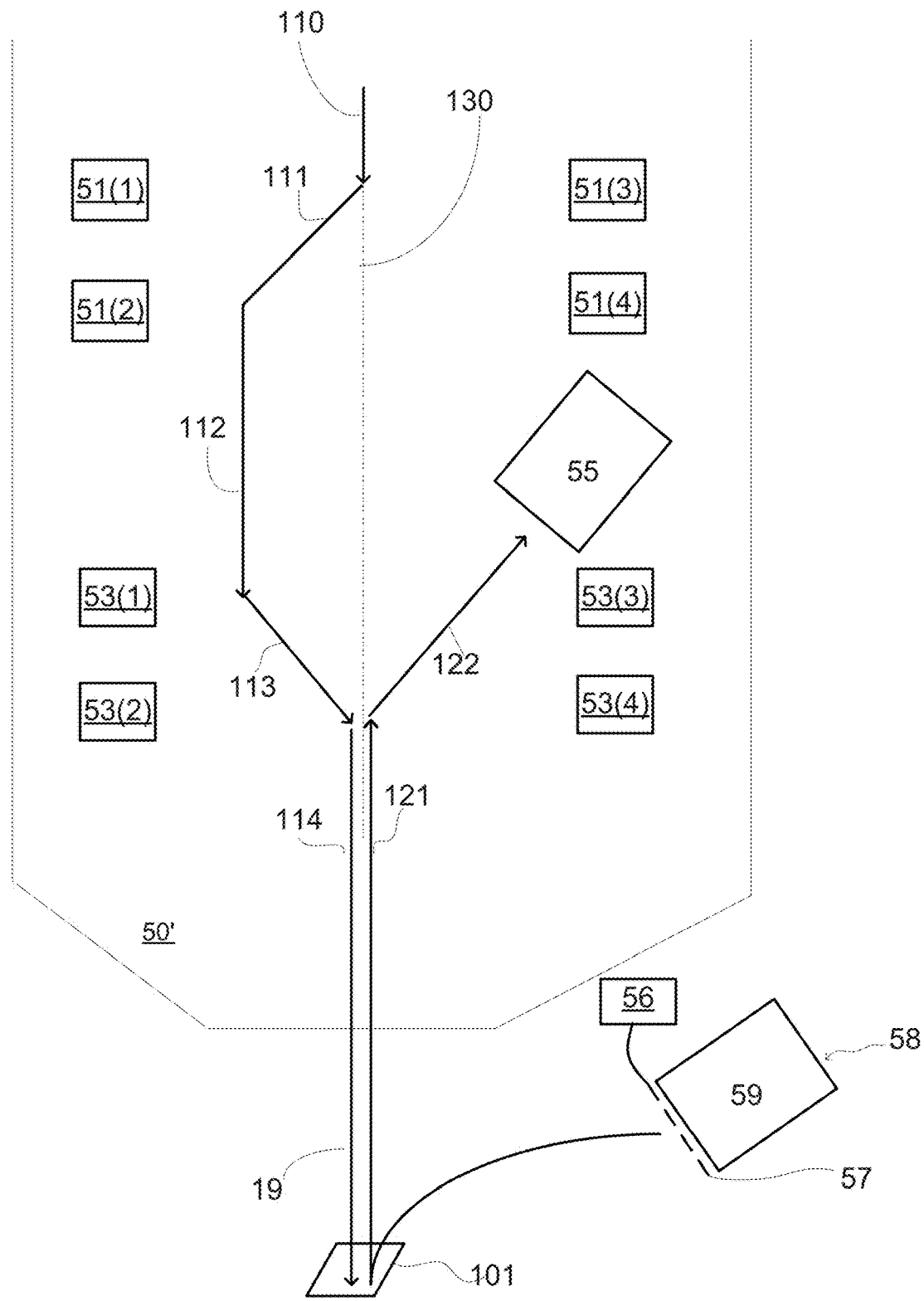
FIG. 7 illustrates an example of a column and a region of a substrate.

FIG. 7 illustrates an example of column 50' and of energy spectrum detector 58 that is located outside column 50'.

Column 50' of FIG. 7 differs from column 50 of FIG. 6 by not including energy spectrum detector 52. Column 50' includes charged particle detector 55.

Energy spectrum detector 58 is located outside column 50' and includes charged particle detector 59 that is preceded by an adjustable energy filter such as grid 57. The adjustable energy filter is supplied with a bias voltage from bias voltage supply unit 56.

The system may include multiple energy spectrum detectors that are located within a column and/or outside a column.

Although FIGS. 6 and 7 illustrate columns that perform four deflections of the primary electron beam, it should be noted that the system may include a column that does not perform any deflection, a column that performs two or three deflections and even a column that deflects the primary electron beam more than four times.

Although FIGS. 1 and 3-7 illustrate a single column, it should be noted that the system may include multiple columns.

Figure 8:
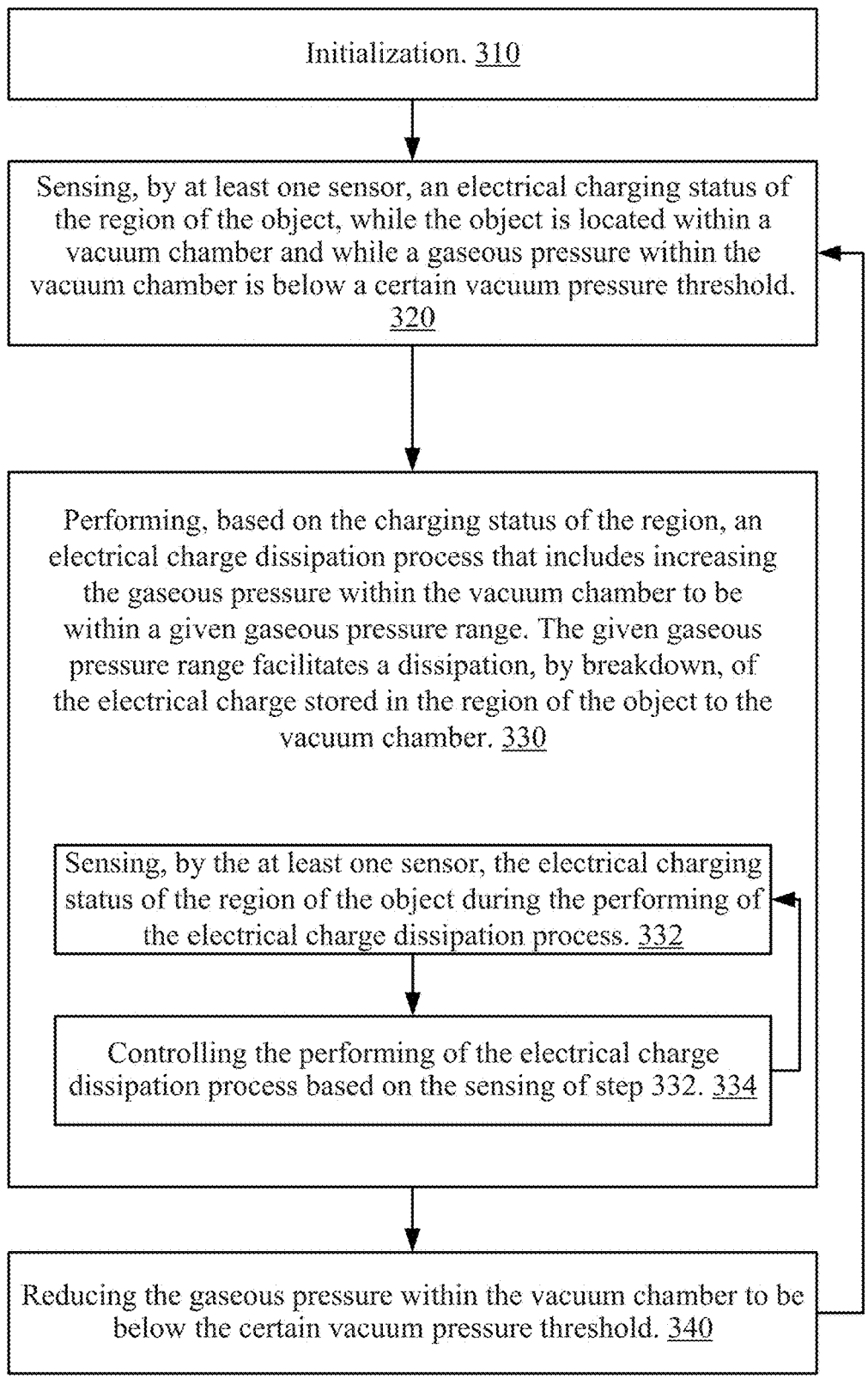
FIG. 8 illustrates an example of a method.

FIG. 8 illustrates method 300 for dissipation of an electrical charge stored in a region of an object.

Method 300 may start by initialization step 310.

Initialization step 310 may include, for example, selecting the region of the object to be sensed.

The selection may be based on design data of the object—for example the size and/or location of insulating regions of the object.

The selection may be based on a history of previous scans of the object—and especially the timing of previous scans and which regions of the object were previously scanned. The history may provide an indication of which regions of the object may be more charged than others.

Initialization step 310 may be followed by step 320 of sensing, by at least one sensor, an electrical charging status of the region of the object, while the object is located within a vacuum chamber and while a gaseous pressure within the vacuum chamber is below a certain vacuum pressure threshold.

The at least one sensor may include any sensor illustrated in the text above and/or any sensor illustrated in FIGS. 1-6.

Step 320 may include, for example, scanning at least a portion of the region of the object with an electron beam and/or finding a cutoff voltage of electrons that pass through the adjustable energy filter.

Step 320 may occur while the vacuum chamber is vacuumed.

Step 320 may occur while the substrate is inspected, reviewed, or measured.

Method 300 may include at least one of inspecting the substrate, reviewing the substrate, and measuring the substrate.

An example of a work point that may be used during step 320 includes—setting a high landing energy (about 1.5 kV), high extraction field (about 2.0 kV), high working distance (about 1.4 mm) and low primary beam current (about 10 pA). A field-of-view of about 1 micron by 1 micron was used to reduce charging by the measurement process itself.

Step 320 may be followed by step 330 of performing, based on the charging status of the region, an electrical charge dissipation process that includes increasing the gaseous pressure within the vacuum chamber to be within a given gaseous pressure range that facilitates a dissipation, by breakdown, of the electrical charge stored in the region of the object to the vacuum chamber.

Step 330 may include determining that the region or the portion of the region are changed to a level that requires electrical charge dissipation process.

The level that requires electrical charge dissipation process may be set in advance, may be changed over time, and the like.

For example—step 330 may include determining to perform the electrical charge dissipation process when the region or the portion of the region are charged to a certain voltage—such as but not limited to 50-1000 volts.

Step 330 may include:
a. Step 332 of sensing, by the at least one sensor, the electrical charging status of the region of the object during the performing of the electrical charge dissipation process.
b. Step 334 of controlling the performing of the electrical charge dissipation process based on the sensing of step 332.

Especially—the increasing the gaseous pressure within the vacuum chamber may stop when reaching the given gaseous pressure range. The reaching of the given gaseous pressure range may be sensed by a gaseous pressure sensor and/or may be sensed by the charging status of the region. When the given gaseous pressure range is reached then the charge may dissipate by breakdown—and dissipation is reflected by the electrical charging status.

Especially—the electrical charge dissipation process may be executed when the given region is charged to at least a certain charge level.

The given gaseous pressure range may:
a. Include a gaseous pressure level that corresponds to a minimal breakdown voltage.
b. Exclude a gaseous pressure level that corresponds to a minimal breakdown voltage.
c. Consist essentially of a gaseous pressure level that corresponds to a minimal breakdown voltage.
d. Consists essentially of gaseous pressure levels that correspond to a range of breakdown voltages that includes a minimal breakdown voltage and other breakdown voltages that deviate by up to a certain factor (for example—three) from the minimal breakdown voltage.
e. Include one or more ranges of gaseous pressure levels that correspond to one or more ranges of breakdown voltages.

Step 330 may be followed by step 340 of reducing the gaseous pressure within the vacuum chamber to be below the certain vacuum pressure threshold.

Step 340 may be followed by step 320.

It should be noted that method 300 may be applied in relation to multiple regions of the object.

Initialization step 310 may include selecting multiple regions of the object and step 320 may include sensing the electrical charging status of each region of the multiple regions of the object.

Alternatively, a sequence that include initialization step 310 and step 320 may be repeated multiple times in order to select the multiple regions of the object and sense the electrical charging status of each region of the multiple regions of the object.

Step 330 may include performing, based on the charging status of the multiple regions, the electrical charge dissipation process. Any function may be applied on the statuses of the multiple regions in order to determine whether to perform the electrical charge dissipation process. For example—weighted sum, average, maximal charged region, and the like.

Method 300 may be used to dissipate an electrical charge to any grounded conductive region, and/or to dissipate the electrical charge from substrates and/or from any parts of the system. One part of the system may be a chuck.

Method 300 may include repetitively, performing the electrical charge dissipation process—even without currently sensing the state of a region of an object. The period between one repetition to another may be determined based on estimates on the charging state of one or more regions. The estimates may be based on previous measurements of one or more region of an object that is (or was) within the vacuum chamber, a model of a charging process, work conditions, and the like.

The dissipation of electrical charge from electrical insulating regions of an object may prevent safety hazards—especially when the vacuum chamber is operated at high vacuum levels.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for dissipation of an electrical charge stored in a region of an object, the method comprising:
sensing, by at least one sensor that comprises a charged particle detector that is preceded by an adjustable energy filter, an electrical charging status of the region of the object, while the object is located within a vacuum chamber and while a gaseous pressure within the vacuum chamber is below a certain vacuum pressure threshold, wherein sensing the electrical charging status of the region of the object comprises finding a cutoff voltage of electrons that pass through the adjustable energy filter; and
performing, based on the electrical charging status of the region of the object, an electrical charge dissipation process that comprises increasing the gaseous pressure within the vacuum chamber to be within a given gaseous pressure range that facilitates a dissipation, by breakdown, of the electrical charge stored in the region of the object to the vacuum chamber.

2. The method according to claim 1, wherein the performing of the electrical charge dissipation process is followed by reducing the gaseous pressure within the vacuum chamber to be below the certain vacuum pressure threshold.

3. The method according to claim 1, wherein the given gaseous pressure range consists essentially of a gaseous pressure level that corresponds to a minimal breakdown voltage.

4. The method according to claim 1, wherein the given gaseous pressure range consists essentially of gaseous pressure levels that correspond to a range of breakdown voltages that comprises a minimal breakdown voltage and other breakdown voltages that deviate by up to a factor of three from the minimal breakdown voltage.

5. The method according to claim 1, further comprising sensing, by the at least one sensor, the electrical charging status of the region of the object during the performing of the electrical charge dissipation process.

6. The method according to claim 1, wherein the at least one sensor comprises a Kelvin probe.

7. The method according to claim 1, wherein the sensing of the electrical charging status of the region of the object comprises scanning at least a portion of the region of the object with an electron beam.

8. The method according to claim 1, wherein the vacuum chamber and the object belong to a charged particle system.

9. The method according to claim 1, wherein the vacuum chamber belongs to a charged particle system.

10. The method according to claim 5, further comprising controlling the performing of the electrical charge dissipation process based on the sensing of the electrical charging status of the region of the object during the performing of the electrical charge dissipation process.

11. The method according to claim 7, further comprising selecting the portion of the region of the object based on design information of the object.

12. The method according to claim 7, further comprising selecting the portion of the region of the object based on previous scans of the object.

13. A computer program product that stores instructions for dissipation of an electrical charge stored in a region of an object, the instructions comprising:
receiving, from at least one sensor that comprises a charged particle detector that is preceded by an adjustable energy filter, data regarding an electrical charging status of the region of the object, while the object is located within a vacuum chamber and while a gaseous pressure within the vacuum chamber is below a certain vacuum pressure threshold, wherein the data regarding the electrical charging status of the region of the object includes a cutoff voltage of electrons that pass through the adjustable energy filter; and
performing, based on the electrical charging status of the region of the object, an electrical charge dissipation process that comprises increasing the gaseous pressure within the vacuum chamber to be within a given gaseous pressure range that facilitates a dissipation, by breakdown, of the electrical charge stored in the region of the object to the vacuum chamber.

14. A method for dissipation of an electrical charge stored in a region of an object, the method comprising:

sensing, by at least one sensor that comprises a charged particle detector that is preceded by an adjustable energy filter, an electrical charging status of the region of the object, while the object is located within a vacuum chamber and while a gaseous pressure within the vacuum chamber is below a certain vacuum pressure threshold, wherein sensing the electrical charging status of the region of the object comprises scanning at least a portion of the region of the object with an electron beam; and performing, based on the electrical charging status of the region of the object, an electrical charge dissipation process that comprises increasing the gaseous pressure within the vacuum chamber to be within a given gaseous pressure range that facilitates a dissipation, by breakdown, of the electrical charge stored in the region of the object to the vacuum chamber.

15. The method according to claim 14, wherein the performing of the electrical charge dissipation process is followed by reducing the gaseous pressure within the vacuum chamber to be below the certain vacuum pressure threshold.

16. The method according to claim 14, wherein the given gaseous pressure range consists essentially of a gaseous pressure level that corresponds to a minimal breakdown voltage.

17. The method according to claim 14, wherein the given gaseous pressure range consists essentially of gaseous pressure levels that correspond to a range of breakdown voltages that comprises a minimal breakdown voltage and other breakdown voltages that deviate by up to a factor of three from the minimal breakdown voltage.

18. The method according to claim 14, further comprising:

sensing, by the at least one sensor, the electrical charging status of the region of the object during the performing of the electrical charge dissipation process; and controlling the performing of the electrical charge dissipation process based on the sensing of the electrical charging status of the region of the object during the performing of the electrical charge dissipation process.

19. The method according to claim 14, further comprising selecting the portion of the region of the object based on design information of the object.

20. The method according to claim 14, further comprising selecting the portion of the region of the object based on previous scans of the object.

* * * * *